US011050279B2

United States Patent
Li

(10) Patent No.: US 11,050,279 B2
(45) Date of Patent: *Jun. 29, 2021

(54) CHARGE/DISCHARGE SWITCH CONTROL CIRCUITS FOR BATTERIES

(71) Applicant: O2Micro Inc., Santa Clara, CA (US)

(72) Inventor: Guoxing Li, Sunnyvale, CA (US)

(73) Assignee: O2Micro, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/745,124

(22) Filed: Jan. 16, 2020

(65) Prior Publication Data
US 2020/0153261 A1 May 14, 2020

Related U.S. Application Data

(63) Continuation of application No. 15/788,712, filed on Oct. 19, 2017, now Pat. No. 10,574,068.

(51) Int. Cl.
| | | |
|---|---|---|
| *H03K 17/687* | (2006.01) | |
| *H01M 10/42* | (2006.01) | |
| *H01M 10/48* | (2006.01) | |
| *G01R 31/382* | (2019.01) | |
| *G01R 31/28* | (2006.01) | |
| *H02J 7/00* | (2006.01) | |

(52) U.S. Cl.
CPC ......... *H02J 7/0047* (2013.01); *H01M 10/425* (2013.01); *H01M 10/482* (2013.01); *H02J 7/0021* (2013.01); *H02J 7/0031* (2013.01); *H02J 7/0036* (2013.01); *H03K 17/6874* (2013.01); *H02J 7/00302* (2020.01); *H02J 7/00304* (2020.01); *H02J 7/00306* (2020.01)

(58) Field of Classification Search
CPC .. H01M 10/425; H01M 10/482; H01M 10/42; H01M 10/48; H02J 7/0021; H02J 7/00302; H02J 7/00304; H02J 7/00306; H02J 7/0031; H02J 7/0036; H02J 7/0047; H02J 7/00; H02J 2007/004; H02J 2007/0039; H02J 2007/0037; H03K 17/6874; Y02E 60/10; H01K 17/687; G01R 531/382; G01R 31/282; G01R 31/28

See application file for complete search history.

(56) References Cited

U.S. PATENT DOCUMENTS

| | | | |
|---|---|---|---|
| 6,194,871 B1 | 2/2001 | Haraguchi et al. | |
| 10,574,068 B2 * | 2/2020 | Li ......................... | H02J 7/0047 |

(Continued)

FOREIGN PATENT DOCUMENTS

| | | |
|---|---|---|
| CN | 202260412 U | 5/2012 |
| CN | 102790409 A | 11/2012 |
| JP | 2001266818 A | 9/2001 |

*Primary Examiner* — Vuthe Siek

(57) ABSTRACT

A charge/discharge switch control circuit for a battery pack includes a set of driving terminals and detection circuitry coupled to the driving terminals. The driving terminals provide driving signals to control a status of a switch circuit to enable charging or discharging of the battery pack. The detection circuitry receives voltages at multiple terminals of the switch circuit, and detects a status of an interface of the battery pack according to the status of the switch circuit and a difference between the voltages. The interface can receive power to charge the battery pack and provide power from the battery pack to a load.

20 Claims, 9 Drawing Sheets

(56) References Cited

U.S. PATENT DOCUMENTS

| | | |
|---|---|---|
| 2002/0050806 A1 | 5/2002 | Fujiwara |
| 2007/0103946 A1* | 5/2007 | Kyono .............. H02M 3/33592 363/21.14 |
| 2011/0089906 A1 | 4/2011 | Sakurai et al. |
| 2011/0156482 A1 | 6/2011 | Yang et al. |
| 2012/0032646 A1 | 2/2012 | Lee |
| 2013/0057221 A1* | 3/2013 | Shibata ................ H02J 7/0029 320/134 |

* cited by examiner

CHARGE/DISCHARGE SWITCH CONTROL CIRCUITS FOR BATTERIES

REFERENCE TO RELATED APPLICATIONS

This application is a Continuation Application of the commonly-owned U.S. patent application Ser. No. 15/788,712, filed on Oct. 19, 2017, now U.S. Pat. No. 10,574,068, which claims benefit under 35 U.S.C. § 119(a) to Application No. 1616798.3, now U.S. Pat. No. 2,543,949, filed with the United Kingdom Intellectual Property Office on Oct. 3, 2016, which was also filed as Application No. 201710918924.3 on Sep. 30, 2017, with the State Intellectual Property Office of the People's Republic of China, which are hereby incorporated by reference in their entirety.

BACKGROUND

FIG. 1 illustrates a conventional switch control circuit 102 that controls a charge switch $Q_{CHG}$ and a discharge switch $Q_{DSG}$ for a battery 138 in a battery pack 100. The control circuit 102 generates driving signals $D_{CHG}$ and $D_{DSG}$ to turn on or off the switches $Q_{CHG}$ and $Q_{DSG}$, under control of a microcontroller unit (MCU) 108. For instance, the MCU 108 can instruct the control circuit 102 to turn on the charge switch $Q_{CHG}$ such that a charger connected to the terminals PACK+ and PACK− charges the battery 138, or to turn off the charge switch $Q_{CHG}$ if the battery 138 is fully charged or an abnormal condition such as over-charge, over-current, or the like occurs. For another instance, the MCU 108 can instruct the control circuit 102 to turn on the discharge switch $Q_{DSG}$ such that battery 138 discharges to power a load connected to the terminals PACK+ and PACK−, or to turn off the discharge switch $Q_{DSG}$ if an abnormal condition such as over-discharge, over-load, or the like occurs. The MCU 108 can also instruct the control circuit 102 to turn off both the switches $Q_{CHG}$ and $Q_{DSG}$ such that the battery pack 100 enters into a deep sleep mode or a low-power mode in which the power can be saved.

However, the conventional switch control circuit 102 has some shortcomings. For example, when the charge switch $Q_{CHG}$ is off, additional circuitry (not shown) is used to detect whether a charger is connected to the terminals PACK+ and PACK− because the conventional switch control circuit 102 does not perform the detection. Similarly, when the discharge switch $Q_{DSG}$ is off, additional circuitry is used to detect whether an above mentioned over-load condition has been removed. Moreover, when the battery 138 is powering a load, additional circuitry is used to detect whether an abnormal condition such as short-circuit load, over-load, or the like occurs. The additional circuitry increases the cost, PCB size, and power consumption of a battery management system for the battery pack 100. Thus, a switch control circuit that not only has the functions of the switch control circuit 102 but also performs the abovementioned detections would be beneficial.

SUMMARY

In one embodiment, a control circuit includes a set of driving terminals and detection circuitry coupled to the driving terminals. The driving terminals provide driving signals to control a status of a switch circuit to enable charging or discharging of a battery pack. The detection circuitry receives voltages at multiple terminals of the switch circuit, and detects a status of an interface of the battery pack according to the status of the switch circuit and a difference between the voltages. The interface can receive power to charge the battery pack in a charge mode and provide power from the battery pack to a load in a discharge mode.

BRIEF DESCRIPTION OF THE DRAWINGS

Features and advantages of embodiments of the claimed subject matter will become apparent as the following detailed description proceeds, and upon reference to the drawings, wherein like numerals depict like parts, and in which:

DETAILED DESCRIPTION

Reference will now be made in detail to the embodiments of the present invention. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Figure 1:
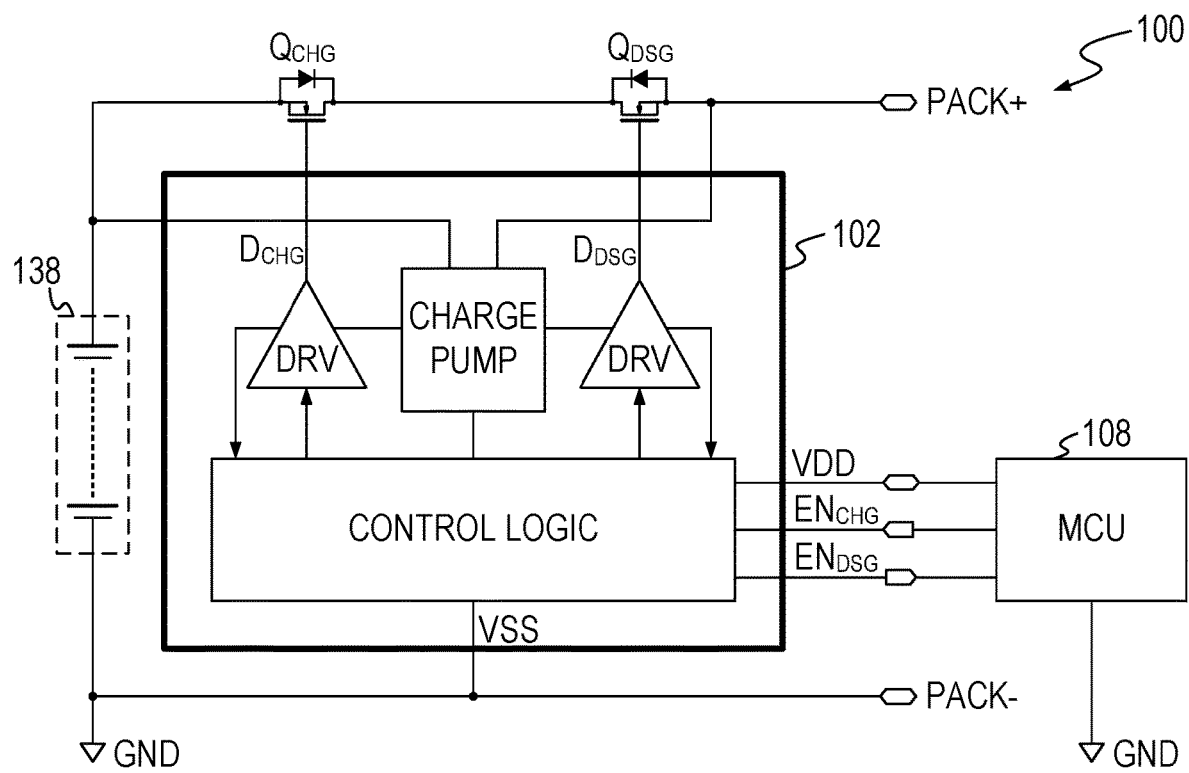
FIG. 1 illustrates a conventional charge/discharge switch control circuit for a battery.

In one embodiment according to the present invention, a charge/discharge switch control circuit generates driving signals to control a status of a switch circuit, e.g., including a charge switch and a discharge switch, to enable charging or discharging of a battery pack. The switch control circuit also receives voltages at multiple terminals of the switch circuit, and detects a status of an interface of the battery pack according to a status of the switch circuit and a difference between the voltages. The interface can receive power from a charger/adapter to charge the battery pack in a charge mode and provide power from the battery pack to a load in a discharge mode. The status of the interface includes whether a charge is connected to the interface, whether an over-heavy or short-circuit load is connected to the interface, whether the over-heavy/short-circuit load has been removed from the interface, etc. Since the switch control circuit can not only control the switch circuit but also can detect a status of the interface of the battery pack, additional circuitry mentioned in relation to the convention switch control circuit 102 in FIG. 1 can be omitted to reduce the cost, size of printed circuit board, and power consumption of a battery management system for the battery pack.

Figure 2:
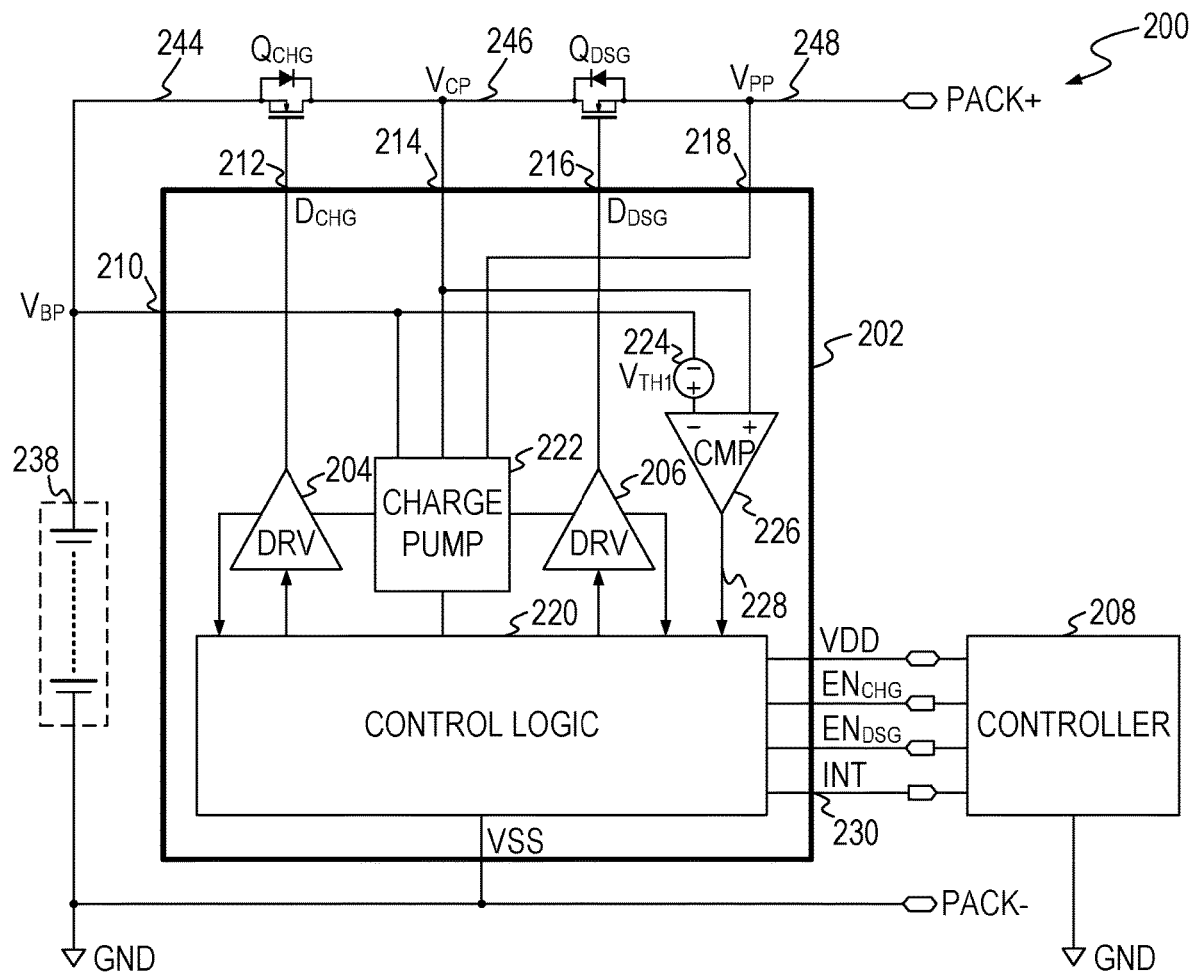
FIG. 2 illustrates an example of a charge/discharge switch control circuit for a battery, in an embodiment of the present invention.

FIG. 2 illustrates an example of a charge/discharge switch control circuit 202 that controls a switch circuit for a battery 238 in a batter pack 200, in an embodiment of the present invention. In one embodiment, the switch circuit includes a charge switch $Q_{CHG}$ and a discharge switch $Q_{DSG}$ (hereinafter, switch circuit $Q_{CHG}$&$Q_{DSG}$). The battery 238 includes one or more rechargeable battery cells, and may include, but is not limited to, lithium ion battery, lithium ion polymer battery, lead-acid battery, nickel cadmium battery, nickel metal hydride battery, or the like. In one embodiment, the control circuit 202 includes sense terminals 210, 214 and 218, driving terminals 212 and 216, communication terminals $EN_{CHG}$, $EN_{DSG}$ and INT, and control circuitry (e.g., including a charge pump 222, driver circuits 204 and 206, a voltage reference providing circuit (e.g., a reference source 224), a comparator 226, and a control logic circuit 220).

In one embodiment, the sense terminals 210, 214 and 218 receive voltages $V_{BP}$, $V_{CP}$ and $V_{PP}$ at terminals 244, 246 and 248 of the switch circuit $Q_{CHG}$&$Q_{DSG}$. The terminal 244 can include a positive terminal of the battery 238. The terminal 244 can be referred to as "charge output terminal" if the battery 238 is charging, or as "discharge input terminal" if the battery 238 is discharging. The terminal 246 can include a drain terminal of the charge switch $Q_{CHG}$, e.g., an n-channel Metal-Oxide-Semiconductor Field-Effect Transistor (MOSFET), and can be referred to as "charge input terminal" if the battery 238 is charging. The terminal 248 can include a positive terminal PACK+ of the battery pack 200. The terminal 248 can be referred to as "charge input terminal" if the battery 238 is charging, or as "discharge output terminal" if the battery 238 is discharging.

In one embodiment, the driving terminals 212 and 216 provide driving signals $D_{CHG}$ and $D_{DSG}$ to control the switch circuit $Q_{CHG}$&$Q_{DSG}$ to enable charging or discharging of the battery pack 200. For example, the driving signal $D_{CHG}$ can selectively turn on the charge switch $Q_{CHG}$ to deliver a charging current of the battery pack 200 from the charge input terminal 246 to the charge output terminal 244. The driving signal $D_{DSG}$ can selectively turn on the discharge switch $Q_{DSG}$ to deliver a discharging current of the battery pack 200 from the discharge input terminal 244 to the discharge output terminal 248.

In one embodiment, the logic circuit 220 communicates with a controller 208, e.g., a microcontroller unit, via the communication terminals $EN_{CHG}$, $EN_{DSG}$ and INT. The terminal $EN_{CHG}$ can receive an enable/disable signal that instructs the logic circuit 220 to turn on or off the charge switch $Q_{CHG}$, the terminal $EN_{DSG}$ can receive an enable/disable signal that instructs the logic circuit 220 to turn on or off the discharge switch $Q_{DSG}$, and the terminal INT can output an interrupt signal 230 indicative of a status of an interface, e.g., including terminals PACK+ and PACK− (hereinafter, interface PACK±), of the battery pack 200.

In one embodiment, detection circuitry, e.g., including the reference source 224, the comparator 226, and the logic circuit 220, receives the voltages $V_{BP}$ and $V_{CP}$ and detects a status of the interface PACK± according to a status of the switch circuit $Q_{CHG}$&$Q_{DSG}$ and a difference between the voltages $V_{BP}$ and $V_{CP}$. In the example of FIG. 2, the status of the interface PACK± includes whether a charger or an adapter is connected to the interface PACK±. More specifically, when the charge switch $Q_{CHG}$ is off, the detection circuitry can receive a first voltage $V_{CP}$ at the charge input terminal 246 and a second voltage $V_{BP}$ at the charge output terminal 244, compare a difference between the voltages $V_{CP}$ and $V_{BP}$ with a first voltage reference $V_{TH1}$, and detect whether a charger/adapter is connected to, e.g., plugged in, the interface PACK± according to a result 228 of the comparison. In one embodiment, if the difference between the voltages $V_{CP}$ and $V_{BP}$ is greater than the voltage reference $V_{TH1}$ for a predefined time interval $\Delta T1$, then the detection circuitry can determine that a charger/adapter is connected to the interface PACK±.

By way of example, when the charge switch $Q_{CHG}$ is off and the discharge switch $Q_{DSG}$ is on, the voltage $V_{CP}$ at the charge input terminal 246 can be greater than the voltage $V_{BP}$ at the charge output terminal 244 if a charger/adapter is connected to the interface PACK±. When both the switches $Q_{CHG}$ and $Q_{DSG}$ are off, if a charger/adapter is connected to the interface PACK±, then the body diode of the discharge switch $Q_{DSG}$ can be forward-biased and therefore the voltage $V_{CP}$ can also be greater than the voltage $V_{BP}$. In one embodiment, when the charge switch $Q_{CHG}$ is off, if a voltage difference of $V_{CP}$-$V_{BP}$ is greater than a voltage reference $V_{TH1}$ for a predefined time interval $\Delta T1$, then it indicates that a charger/adapter is connected to the interface PACK±. In one embodiment, the reference source 224, e.g., a voltage providing circuit, has a voltage level $V^{TH1}$, and is coupled between the terminal 244 and the comparator 226 to provide a combination signal, representing a combination of the voltage $V_{BP}$ and the voltage reference $V_{TH1}$, to the comparator 226. In the example of FIG. 2, the combination signal has a voltage level of $V_{BP}$+$V_{TH1}$, and the comparator 226 compares the voltage $V_{BP}$+$V_{TH1}$ with the voltage $V_{CP}$ to generate a comparison result 228 indicative of whether the voltage $V_{CP}$ is greater than the voltage $V_{BP}$+$V_{TH1}$. The comparison result 228 also indicates whether the voltage level $V_{CP}$−$V_{BP}$ is greater than the voltage reference $V_{TH1}$. The logic circuit 220 can include a timer (not shown) that starts to count time on detection of a comparison result 228 indicating that the voltage level $V_{CP}$−$V_{BP}$ is greater than the voltage reference $V^{TH1}$. If the logic level of the comparison result 228 remains unchanged for a time interval $\Delta T1$, then the logic circuit 220 determines that a charger/adapter is connected to the interface PACK±.

The logic circuit 220 can also generate an interrupt signal 230 to inform the controller 208 of the availability of the charger/adapter. In response to the interrupt signal 230, the controller 208 can instruct the control circuit 202 to turn on the charge switch $Q_{CHG}$ if the battery 238 is not fully charged.

Figure 3:
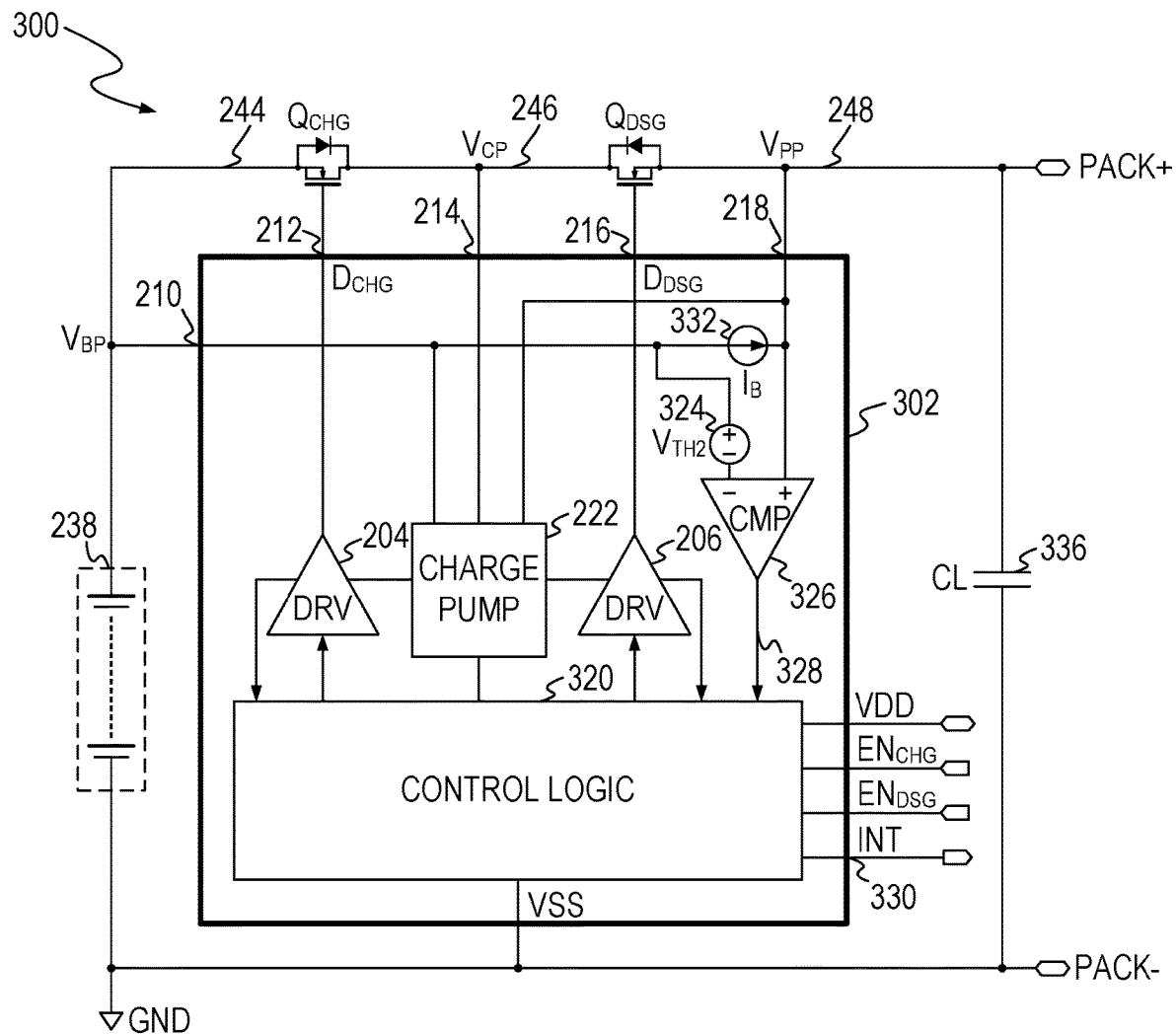
FIG. 3 illustrates an example of a charge/discharge switch control circuit for a battery, in another embodiment of the present invention.

FIG. 3 illustrates an example of a charge/discharge switch control circuit 302, in another embodiment of the present invention. FIG. 3 is described in combination with FIG. 2. Similar to the control circuit 202 in FIG. 2, the control circuit 302 can detect a status of the interface PACK±. In the example of FIG. 3, the detection circuitry includes a current providing circuit (e.g., a current source 332), a reference source 324, a comparator 326, and a control logic circuit 320. The control circuit 302 can detect whether a load, e.g., an over-heavy load, a short-circuit load, or the like, is removed from the interface PACK±.

More specifically, in one embodiment, during discharging of the battery 238, if an over-heavy/short-circuit load condition is detected, then the control circuit 302 disables the discharge switch $Q_{DSG}$ to stop the discharging. When the discharge switch $Q_{DSG}$ is off, the detection circuitry can provide a bias current $I_B$ to charge a capacitor 336 coupled to the discharge output terminal 248, e.g., coupled between the terminals PACK+ and PACK–. The detection circuitry can receive a third voltage $V_{PP}$ at the discharge input terminal 244 and a fourth voltage $V_{PP}$ at the discharge output terminal 248, compare a difference between the third and fourth voltages $V_{PP}$ and $V_{PP}$ with a second voltage reference $V_{TH2}$, and detect whether the over-heavy/short-circuit load is removed from the interface PACK± according to a result 328 of the comparison. In one embodiment, if the difference between the voltages $V_{BP}$ and $V_{PP}$ is less than the voltage reference $V_{TH2}$ for a predefined time interval ΔT2, then the detection circuitry determines that the over-heavy/short-circuit load is removed from the interface PACK±.

By way of example, when the discharge switch $Q_{DSG}$ is off, if an over-heavy/short-circuit load is connected to the interface PACK±, then a voltage $V_{PP}$ at the discharge output terminal 248 (e.g., the terminal PACK+) can be pulled down to a voltage level that is much less than the voltage $V_{BP}$ at the discharge input terminal (e.g., the positive terminal of the battery 238). In one embodiment, the abovementioned current $I_B$ that charges the capacitor 336 is relatively small (e.g., hundreds of μA level) and the charging of the capacitor 336 does not increase the voltage $V_{PP}$ if the over-heavy/short-circuit load is still connected to the interface PACK±. On the other hand, if the over-heavy/short-circuit load has been removed from the interface PACK±, then the charging of the capacitor 336 can increase the voltage $V_{PP}$. When the voltage $V_{PP}$ increases to a level such that the difference of $V_{BP}$–$V_{PP}$ is less than a voltage reference $V_{TH2}$, it indicates that the over-heavy/short-circuit load has been removed from the interface PACK±. In one embodiment, the current source 332 can generate a current $I_B$ to charge the capacitor 336. The reference source 324 has a voltage level $V_{TH2}$, and is coupled between the terminal 244 and the comparator 326 to provide a combination signal, representing a combination of the voltage $V_{BP}$ and the voltage reference $V_{TH2}$, to the comparator 326. In the example of FIG. 3, the combination signal has a voltage level of $V_{BP}$–$V_{TH2}$, and the comparator 326 compares the voltage $V_{BP}$–$V_{TH2}$ with the voltage $V_{PP}$ to generate a comparison result 328 indicative of whether the voltage $V_{BP}$–$V_{TH2}$ is less than the voltage $V_{PP}$. The comparison result 228 also indicates whether the voltage level $V_{BP}$–$V_{PP}$ is less than the voltage reference $V_{TH2}$. The logic circuit 320 can include a timer (not shown) that starts to count time on detection of a comparison result 328 indicating that the voltage level $V_{BP}$–$V_{PP}$ is less than the voltage reference $V_{TH2}$. If the logic level of the comparison result 328 remains unchanged for a predefined time interval ΔT2, then the logic circuit 320 determines that an above mentioned over-heavy/short-circuit load is removed from the interface PACK±.

The logic circuit 320 can also generate an interrupt signal 330 to inform a controller (e.g., similar to the controller 208) of the removal of the over-heavy/short-circuit load. In response to the interrupt signal 330, the controller can instruct the control circuit 302 to turn on the discharge Switch $Q_{DSG}$.

Figure 4:
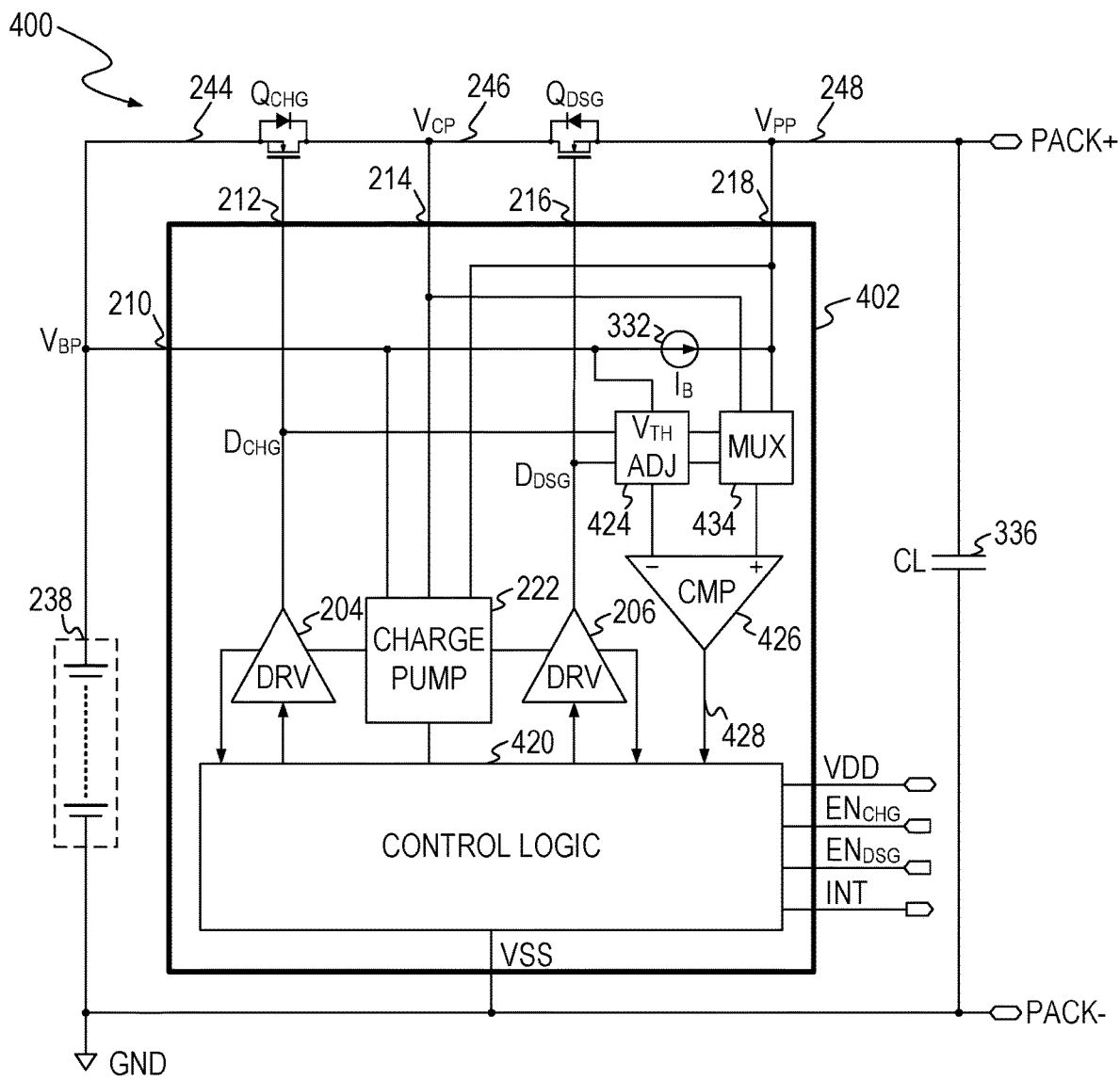
FIG. 4 illustrates an example of a charge/discharge switch control circuit for a battery, in another embodiment of the present invention.

FIG. 4 illustrates an example of a charge/discharge switch control circuit 402, in another embodiment of the present invention. FIG. 4 is described in combination with FIG. 2 and FIG. 3. In the example of FIG. 4, the detection circuitry includes a current source 332, a reference generator 424, a multiplexer 434, a comparator 426, and a control logic circuit 420. The control circuit 402 can detect whether a charger/adapter is connected to the interface PACK±when the charge switch $Q_{CHG}$ is off, and detect whether a load, e.g., an over-heavy/short-circuit load, is removed from the interface PACK± when the discharge switch $Q_{DSG}$ is off.

In one embodiment, the comparator 426 compares a difference between voltages $V_{BP}$, $V_{CP}$ and $V_{PP}$ with a voltage reference, e.g., an abovementioned voltage reference $V_{TH1}$ or $V_{TH2}$, to generate a comparison result 428 indicative of a status of the interface PACK±. The reference generator 424 can control a level of the voltage reference according to the driving signals $D_{CHG}$ and $D_{DSG}$. The multiplexer can receive an input voltage $V_{CP}$ at the charge input terminal 246 and an output voltage $V_{PP}$ at the discharge output terminal 248, and selectively provide a voltage of the input and output voltages $V_{CP}$ and $V_{PP}$ to the comparator 426 according to the driving signals $D_{CHG}$ and $D_{DSG}$.

For example, the reference generator 424 and the multiplexer 434 can be controlled by the driving signals $D_{CHG}$ and $D_{DSG}$. If the driving signals $D_{CHG}$ and $D_{DSG}$ include signal levels that turn off the charge switch $Q_{CHG}$ and turn on the discharge switch $Q_{DSG}$, then the reference generator 424 sets the voltage reference to be $V_{TH1}$, and the multiplexer 434 provides the input voltage $V_{CP}$ to the comparator 426. The reference generator 424 receives a first signal $V_{BP}$ indicative of a voltage of the battery 238 and generates a second signal indicative of a combination of the first signal $V_{BP}$ and the voltage reference $V_{TH1}$. In one embodiment, similar to the combination signal described in relation to FIG. 2, the second signal has a voltage level of $V_{BP}$+$V_{TH1}$. Similar to the comparator 226 described in relation to FIG. 2, the comparator 426 compares the second signal $V_{BP}$+$V_{TH1}$ with the input voltage $V_{CP}$ to generate a comparison result 428 indicative of whether a charger/adapter is connected to the interface PACK±. If the logic circuit 420 detects that the input voltage $V_{CP}$ is greater than the second signal $V_{BP}$+$V_{TH1}$, i.e., $V_{CP}$–$V_{BP}$>$V_{TH1}$, for a predefined time interval ΔT1, then the logic circuit 420 determines that a charger/adapter is connected to the interface PACK±.

For another example, if the driving signals $D_{CHG}$ and $D_{DSG}$ include signal levels that turn on the charge switch $Q_{CHG}$ and turn off the discharge switch $Q_{DSG}$, then the reference generator 424 sets the voltage reference to be $V_{TH2}$, and the multiplexer 434 provides the output voltage $V_{PP}$ to the comparator 426. The reference generator 424 receives a first signal $V_{BP}$ indicative of a voltage of the battery 238 and generates a third signal indicative of a combination of the first signal $V_{BP}$ and the voltage reference $V_{TH2}$. In one embodiment, similar to the combination signal described in relation to FIG. 3, the third signal has a voltage level of $V_{BP}$–$V_{TH2}$. The current source 332 provides a current $I_B$ to charge the capacitor 336 coupled to the discharge output terminal 248. Similar to the comparator 326 described in relation to FIG. 3, the comparator 426 compares the third signal $V_{BP}$–$V_{TH2}$ with the output voltage $V_{PP}$ to generate a comparison result 428 indicative of whether a load (e.g., an over-heavy/short-circuit load) is removed from the interface PACK±. If the logic circuit 420 detects that the third signal $V_{BP}$–$V_{TH2}$ is less than the output voltage $V_{PP}$, i.e., $V_{BP}$–$V_{PP}$<$V_{TH2}$, for a predefined time interval ΔT2, then the logic circuit 420 determines that the load is removed from the interface PACK±.

Figure 5:
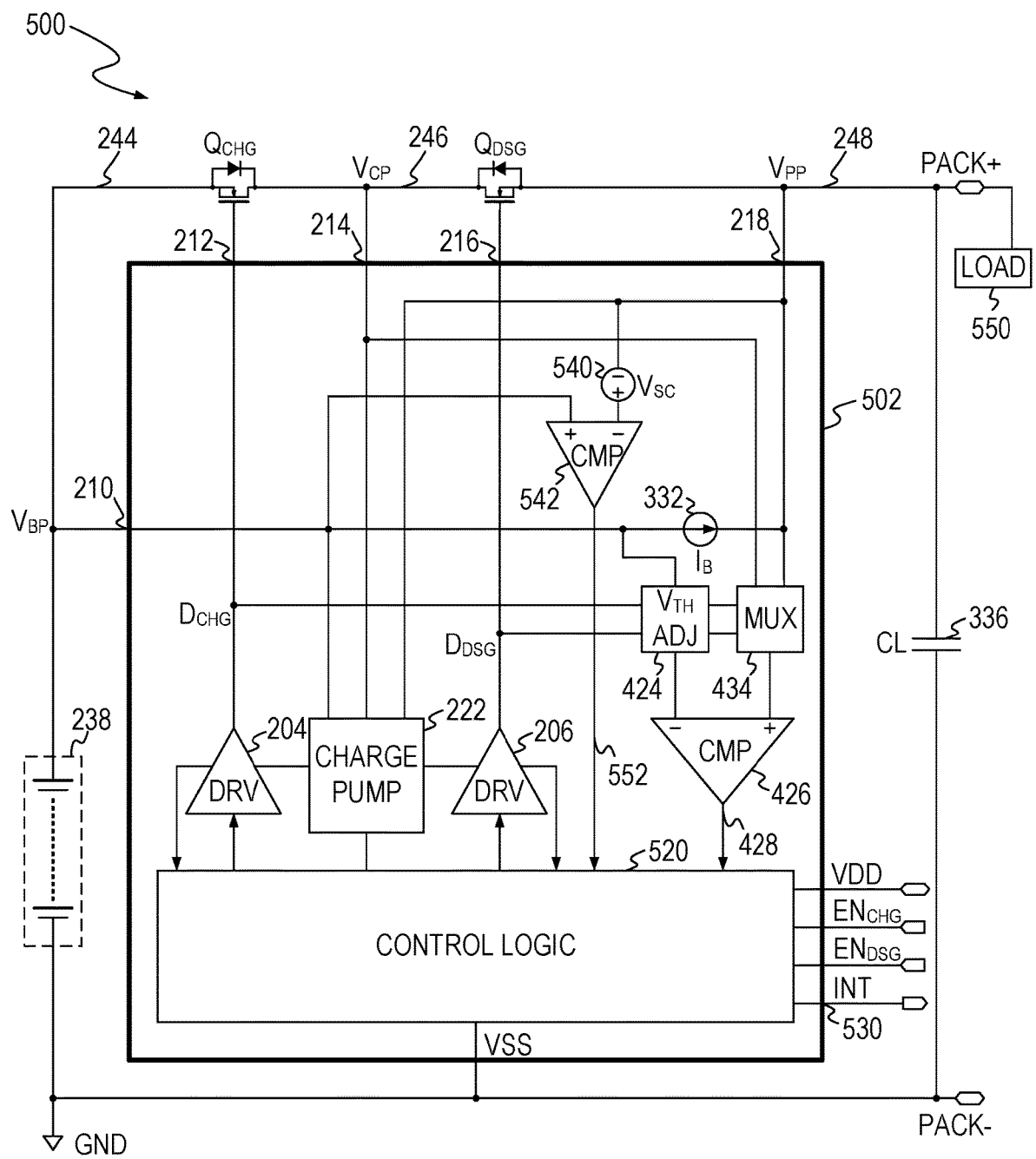
FIG. 5 illustrates an example of a charge/discharge switch control circuit for a battery, in another embodiment of the present invention.

FIG. 5 illustrates an example of a charge/discharge switch control circuit 502, in another embodiment of the present invention. FIG. 5 is described in combination with FIG. 2, FIG. 3 and FIG. 4. In the example of FIG. 5, the detection circuitry further includes a reference source 540 and a comparator 542. In one embodiment, during discharging of the battery 238, the detection circuitry can detect whether a load 550 connected to the interface PACK± is in an over-heavy status. In one embodiment, as used herein "over-heavy status" means that the power consumed by a load connected to the interface PACK± is greater than a power threshold. In one embodiment, the power that a load normally requires is within a power range, and the power threshold can be equal to or great than the maximum power of the power range. In one embodiment, if a load connected to the interface PACK± is short-circuited, the load can also be considered to be in an over-heavy status.

More specifically, in one embodiment, during discharging, the switch circuit $Q_{CHG}$&$Q_{DSG}$ is turned on (e.g., at least the discharge switch $Q_{DSG}$ is turned on), and the detection circuitry receives a fifth voltage $V_{BP}$ at the discharge input terminal 244 and a sixth voltage $V_{PP}$ at the discharge output terminal 248, compares a difference between the fifth and sixth voltages $V_{BP}$ and $V_{PP}$ with a third voltage reference $V_{SC}$, and detects a status of the load 550 according to a result 552 of the comparison. If the difference between the voltages $V_{BP}$ and $V_{PP}$ is greater than the voltage reference $V_{SC}$ for a predefined time interval ΔT3, then the detection circuitry determines that the load 550 is in an over-heavy status.

By way of example, if the load 550 is in an over-heavy status, then the load 550 can pull down the voltage $V_{PP}$ at the discharge output terminal 248. In one embodiment, if the voltage $V_{PP}$ deceases to a level such that the voltage difference $V_{BP}-V_{PP}$ is greater than the voltage reference $V_{SC}$, then it indicates that the load 550 is in the over-heavy status. In one embodiment, the reference source 540 has a voltage level $V_{SC}$, and is coupled between the discharge output terminal 248 and the comparator 542 to provide a combination signal, e.g., representing a combination of the voltage $V_{PP}$ and the voltage reference $V_{SC}$, to the comparator 542. In the example of FIG. 5, the combination signal has a voltage level of $V_{PP}+V_{SC}$, and the comparator 542 compares the voltage $V_{BP}$ with the voltage $V_{PP}+V_{SC}$ to generate a comparison result 552 indicative of whether the voltage $V_{BP}$ is greater than the voltage $V_{PP}+V_{SC}$. The comparison result 552 also indicates whether the voltage level $V_{BP}-V_{PP}$ is greater than the voltage reference $V_{SC}$. The logic circuit 520 can include a timer (not shown) that starts to count time on detection of a comparison result 552 indicating that the voltage level $V_{BP}-V_{PP}$ is greater than the voltage reference $V_{SC}$. If the logic level of the comparison result 552 remains unchanged for a predefined time interval ΔT3, then the logic circuit 520 determines that the load 550 is in an over-heavy status.

The logic circuit 520 can also generate an interrupt signal 530 to inform a controller (e.g., similar to the controller 208) of the over-heavy status of the load 550. In response to the interrupt signal 530, the controller can instruct the control circuit 502 to turn off the discharge switch $Q_{DSG}$ or reduce the load 550.

Figure 6:
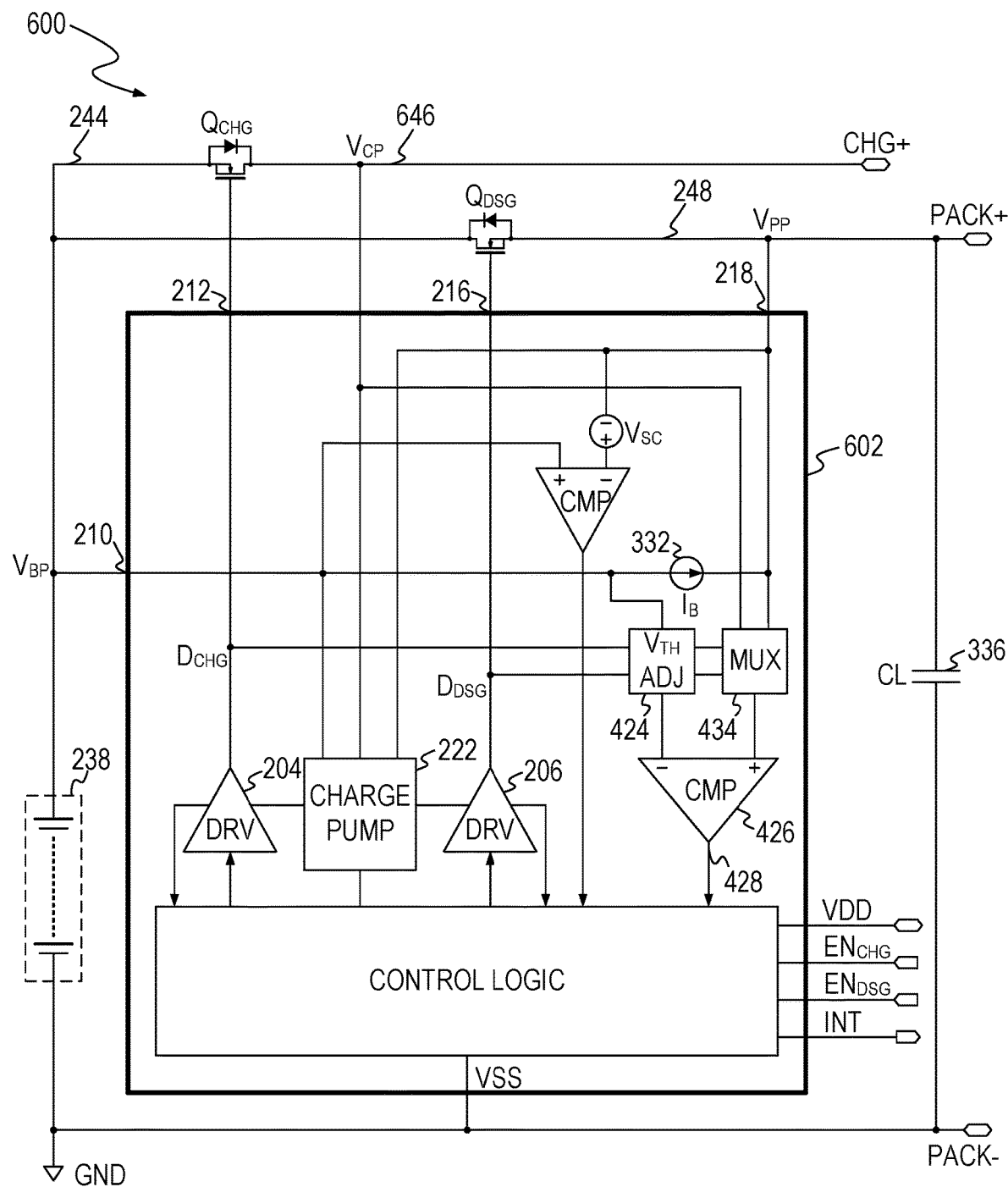
FIG. 6 illustrates an example of a charge/discharge switch control circuit for a battery, in another embodiment of the present invention.

FIG. 6 illustrates an example of a charge/discharge switch control circuit 602, in another embodiment of the present invention. FIG. 6 is described in combination with FIG. 2, FIG. 3, FIG. 4 and FIG. 5. In the example of FIG. 6, the switch circuit $Q_{CHG}$&$Q_{DSG}$ includes a charging path and a discharging path. The charging path includes a charge input terminal 646, a charge switch $Q_{CHG}$, and a charge output terminal 244. The discharging path includes a discharge input terminal 244, a discharge switch $Q_{DSG}$, and a discharge output terminal 248. Additionally, the interface of the battery pack 600 includes terminals PACK+, PACK−, and CHG+ (hereinafter, interface PACK±&CHG+). The terminals PACK+ and PACK− can be used to provide power to a load, and the terminal CHG+ can be used to receive power from a charger/adapter.

In one embodiment, the control circuit 602 in FIG. 6 has structure and functions similar to those of the control circuit 502 in FIG. 5, except that the multiplexer 434 in the control circuit 602 receives a voltage $V_{CP}$ at the charge input terminal 646, instead of the charge input terminal 246 mentioned in relation to FIG. 5. Thus, a detailed description of the control circuit 602 is omitted here for purpose of simplicity.

Figure 7:
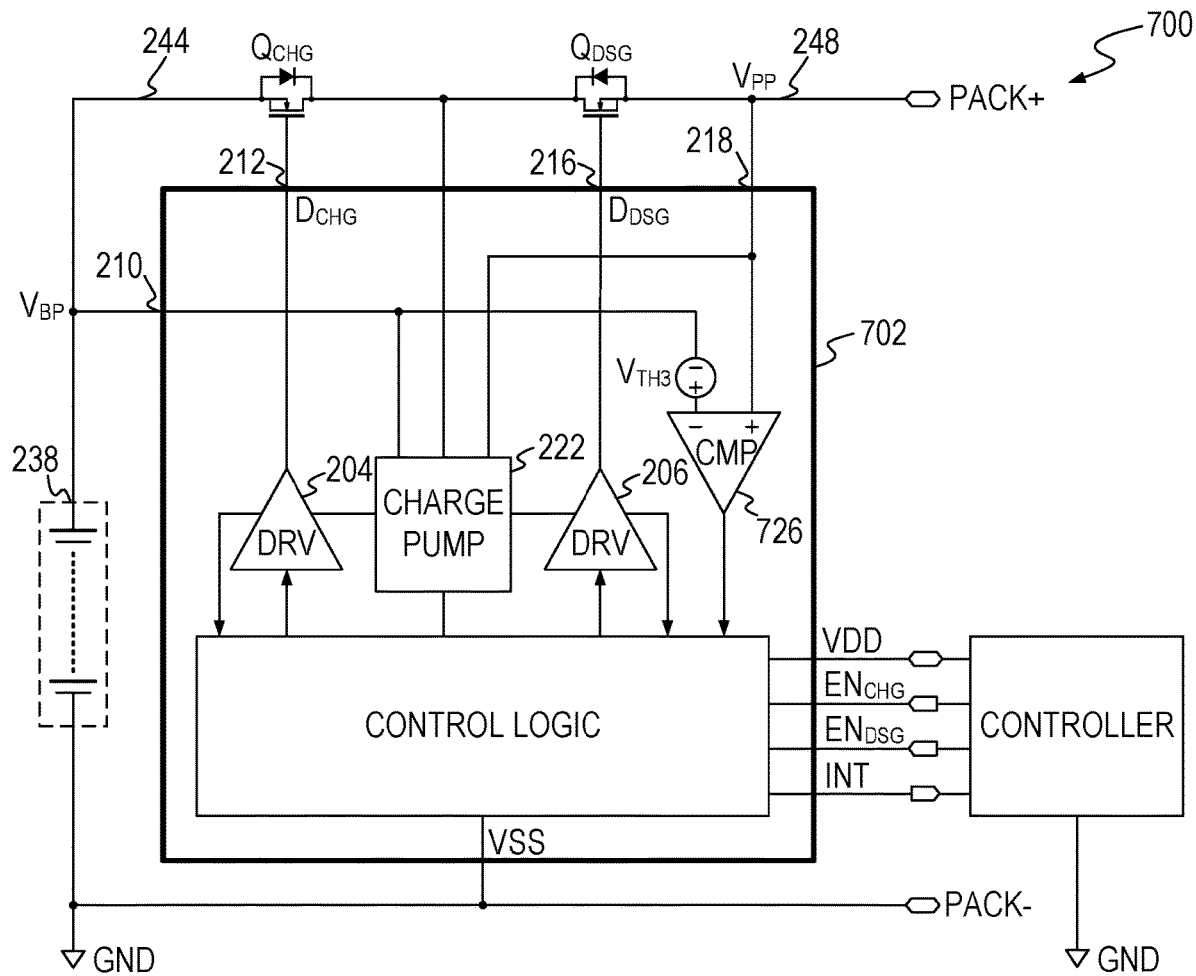
FIG. 7 illustrates an example of a charge/discharge switch control circuit for a battery, in another embodiment of the present invention.

FIG. 7 illustrates an example of a charge/discharge switch control circuit 702, in another embodiment of the present invention. FIG. 7 is described in combination with FIG. 2. In one embodiment, the control circuit 702 in FIG. 7 has structure and functions similar to those of the control circuit 202 in FIG. 2, except that the comparator 726 in FIG. 7 receives a voltage $V_{PP}$ at the charge input terminal 248, instead of a voltage $V_{CP}$ at the charge input terminal 246 described in relation to FIG. 2. Thus, a detailed description of the control circuit 702 is omitted here for purpose of simplicity. Additionally, the control circuit 702 can include components similar to the reference source 540 and comparator 542 in FIG. 5.

Figure 8:
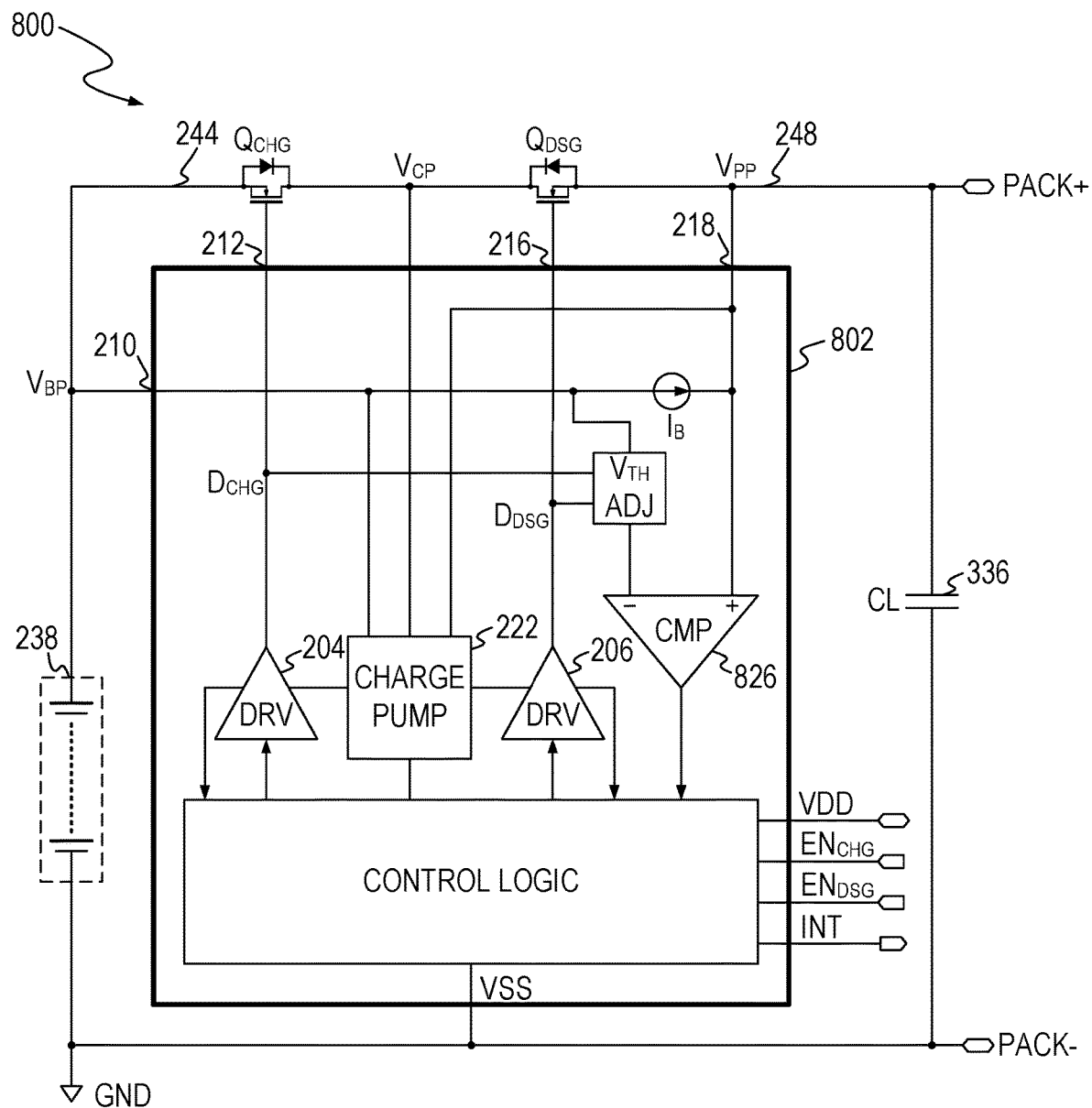
FIG. 8 illustrates an example of a charge/discharge switch control circuit for a battery, in another embodiment of the present invention.

FIG. 8 illustrates an example of a charge/discharge switch control circuit 802, in another embodiment of the present invention. FIG. 8 is described in combination with FIG. 4. In one embodiment, the control circuit 802 in FIG. 8 has structure and functions similar to those of the control circuit 402 in FIG. 4, except that the multiplexer 434 in FIG. 4 is omitted in FIG. 8 and the comparator 826 in FIG. 8 receives a voltage $V_{PP}$ at the terminal 248 (which can be a charge input terminal during charging or a discharge output terminal during discharging), instead of an output voltage from the multiplexer 434. Thus, a detailed description of the control circuit 802 is omitted here for purpose of simplicity. Additionally, the control circuit 802 can include components similar to the reference source 540 and comparator 542 in FIG. 5.

Figure 9:
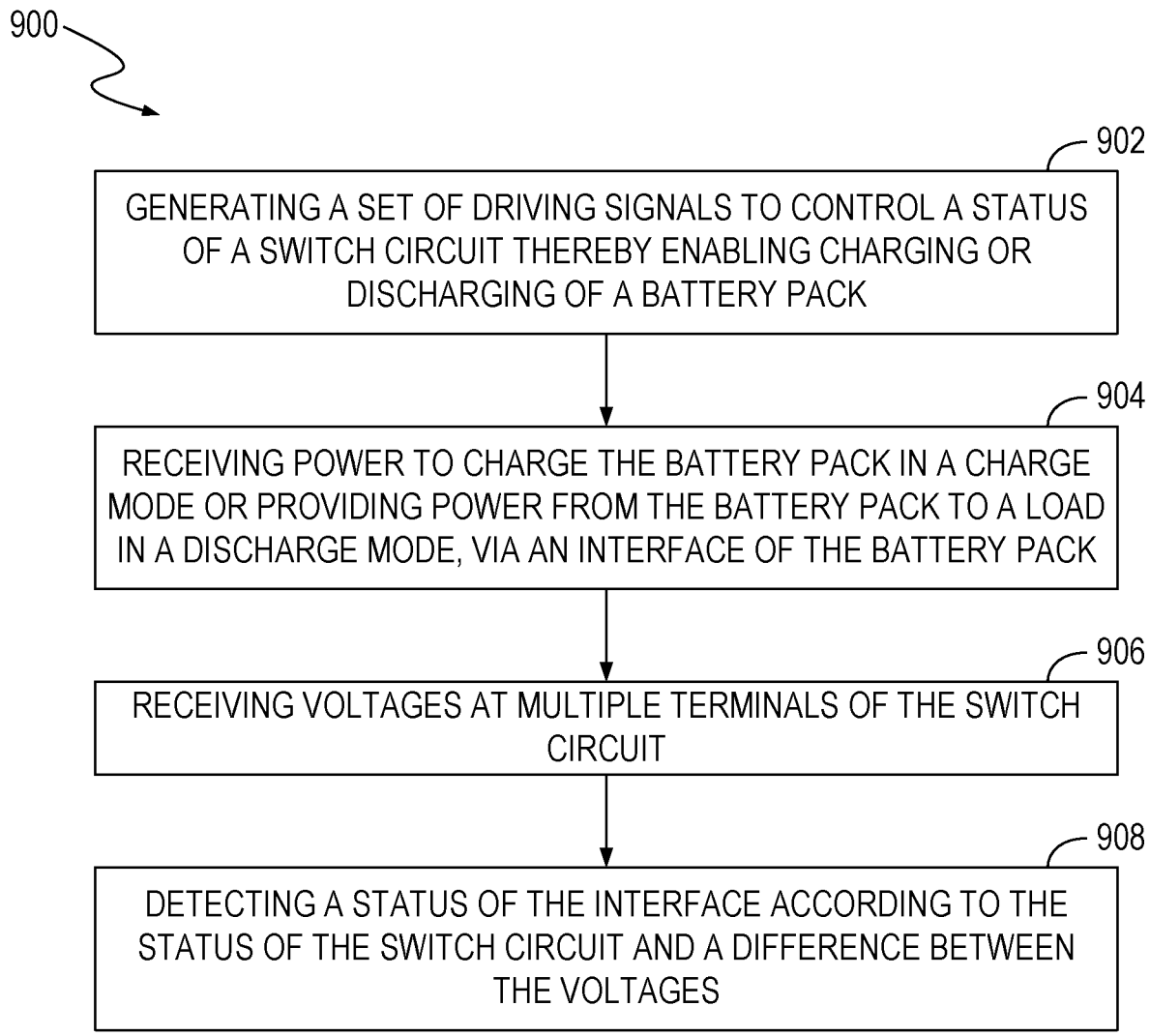
FIG. 9 illustrates a flowchart of examples of operations performed by a charge/discharge switch control circuit, in an embodiment of the present invention.

FIG. 9 illustrates a flowchart 900 of examples of operations performed by a charge/discharge switch control circuit, in an embodiment of the present invention. Although specific steps are disclosed in FIG. 9, such steps are examples for illustrative purposes. That is, embodiments according to the present invention are well suited to performing various other steps or variations of the steps recited in FIG. 9. FIG. 9 is described in combination with FIG. 2, FIG. 3, FIG. 4, FIG. 5, FIG. 6, FIG. 7 and FIG. 8.

In block 902, a control circuit (e.g., 202, 302, 402, 502, 602, 702 or 802) generates a set of driving signals (e.g., $D_{CHG}$ and $D_{DSG}$) to control a status of a switch circuit (e.g., $Q_{CHG}$&$Q_{DSG}$) thereby enabling charging or discharging of a battery pack (e.g., 200, 300, 400, 500, 600, 700 or 800)

In block 904, an interface (e.g., PACK± or PACK±&CHG+) of the battery pack receives power to charge the battery pack in a charge mode or provides power from the battery pack to a load in a discharge mode. In one embodiment, the battery pack is in a charge mode when the battery pack is charged by a power source such as a charger, an adapter, or the like. In one embodiment, the battery pack is in a discharge mode when the battery pack discharges power.

In block 906, detection circuitry in the control circuit receives voltages (e.g., $V_{BP}$, $V_{CP}$ and/or $V_{PP}$) at multiple terminals (e.g., 244, 246, 646 and/or 248) of the switch circuit (e.g., $Q_{CHG}$&$Q_{DSG}$).

In block 908, the detection circuitry detects a status of the interface according to the status of the switch circuit and a difference (e.g., $V_{CP}$-$V_{BP}$ or $V_{BP}$-$V_{PP}$) between the voltages. In one embodiment, the status of the interface includes whether a charger is connected to the interface when the charge switch is off $Q_{CHG}$, whether a load connected to the interface is in an over-heavy status, and/or whether an over-heavy/short-circuit load is removed from the interface.

While the foregoing description and drawings represent embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

I claim:

1. A control circuit comprising:
   a plurality of driving terminals that provide driving signals to control a status of a switch circuit to enable charging or discharging of a battery pack, wherein said switch circuit comprises a charge switch, a discharge switch, and a plurality of terminals coupled to said charge switch and said discharge switch;
   detection circuitry, coupled to said driving terminals, that receives voltages at said plurality of terminals of said switch circuit, and detects a status of an interface of said battery pack according to said status of said switch circuit and a difference between said voltages, said interface operable for receiving power to charge said battery pack in a charge mode when said charge switch is on, and providing power from said battery pack to a load in a discharge mode when said discharge switch is on,
   wherein said detection circuitry comprises:
      a comparator that compares said difference between said voltages with a voltage reference to generate a comparison result; and
      a control logic circuit, coupled to said comparator, that determines said status of said interface according to said comparison result.

2. The control circuit of claim 1, wherein said plurality of terminals comprise a charge input terminal and a charge output terminal, wherein said driving signals comprise a signal that selectively turns on said charge switch in said switch circuit to deliver a charging current of said battery pack from said charge input terminal to said charge output terminal, and wherein when said charge switch is off, said detection circuitry receives a first voltage at said charge input terminal and a second voltage at said charge output terminal, compares a voltage difference between said first and second voltages with said voltage reference, and detects whether a charger is connected to said interface according to a result of the comparison between said voltage difference and said voltage reference.

3. The control circuit of claim 2, wherein if said voltage difference between said first and second voltages is greater than said voltage reference for a predefined time interval, then said detection circuitry determines that said charger is connected to said interface.

4. The control circuit of claim 1, wherein said plurality of terminals comprise a discharge input terminal and a discharge output terminal, wherein said driving signals comprise a signal that selectively turns on said discharge switch in said switch circuit to deliver a discharging current of said battery pack from said discharge input terminal to said discharge output terminal, and wherein when said discharge switch is off, said detection circuitry provides a current to charge a capacitor coupled to said discharge output terminal, receives a first voltage at said discharge input terminal and a second voltage at said discharge output terminal, compares a voltage difference between said first and second voltages with said voltage reference, and detects whether said load is removed from said interface according to a result of the comparison between said voltage difference and said voltage reference.

5. The control circuit of claim 4, wherein if said voltage difference between said first and second voltages is less than said voltage reference for a predefined time interval, then said detection circuitry determines that said load is removed from said interface.

6. The control circuit of claim 1, wherein said detection circuitry comprises:
   a reference generator, coupled to said comparator, that sets said voltage reference to a first voltage reference or a second voltage reference according to said driving signals; and
   a multiplexer, coupled to said comparator, that receives an input voltage at a charge input terminal and an output voltage at a discharge output terminal, and selectively provides a voltage of said input and output voltages to said comparator according to said driving signals,
   wherein said charge switch delivers a current from said charge input terminal to charge said battery pack if said charge switch is on, and wherein said discharge switch delivers a discharging current of said battery pack to said discharge output terminal if said discharge switch is on.

7. The control circuit of claim 6, wherein if said driving signals comprise signal levels that turn off said charge switch and turn on said discharge switch, then said reference generator sets said voltage reference to be said first voltage reference, and said multiplexer provides said input voltage to said comparator.

8. The control circuit of claim 7, wherein said reference generator receives a first signal indicative of a voltage of a battery in said battery pack and generates a second signal indicative of a combination of said first signal and said first voltage reference, and wherein said comparator compares said second signal with said input voltage to generate a comparison result indicative of whether a charger is connected to said interface.

9. The control circuit of claim 6, wherein if said driving signals comprise signal levels that turn on said charge switch and turn off said discharge switch, then said reference generator sets said voltage reference to be said second voltage reference, and said multiplexer provides said output voltage to said comparator.

10. The control circuit of claim 9, wherein said reference generator receives a first signal indicative of a voltage of a battery in said battery pack and generates a second signal indicative of a combination of said first signal and said second voltage reference, wherein said detection circuitry provides a current to charge a capacitor coupled to said discharge output terminal, and wherein said comparator compares said second signal with said output voltage to generate a comparison result indicative of whether said load is removed from said interface.

11. The control circuit of claim 1, wherein said plurality of terminals comprise a discharge input terminal and a discharge output terminal, wherein said switch circuit is operable for delivering a discharging current of said battery pack from said discharge input terminal to said discharge output terminal, and wherein said detection circuitry receives a first voltage at said discharge input terminal and a second voltage at said discharge output terminal, compares a voltage difference between said first and second voltages with said voltage reference, and detects a status of said load according to a result of the comparison between said voltage difference and said voltage reference.

12. The control circuit of claim 11, wherein if said voltage difference between said first and second voltages is greater than said voltage reference for a predefined time interval, then said detection circuitry determines that load is in an over-heavy status.

13. A battery pack comprising:
a battery;
a switch circuit, coupled to said battery, that enables charging or discharging of said battery under control of a plurality of driving signals, wherein said switch circuit comprises a charge switch, a discharge switch, and a plurality of terminals coupled to said charge switch and said discharge switch;
a control circuit, coupled to said switch circuit and said battery, that provides said driving signals, receives voltages at said plurality of terminals of said switch circuit, and detects a status of an interface of said battery pack according to a status of said switch circuit and a difference between said voltages, said interface operable for receiving power to charge said battery in a charge mode when said charge switch is on, and providing power from said battery to a load in a discharge mode when said discharge switch is on,
wherein said control circuit comprises:
a comparator that compares said difference between said voltages with a voltage reference to generate a comparison result; and
a control logic circuit, coupled to said comparator, that determines said status of said interface according to said comparison result.

14. The battery pack of claim 13, wherein said plurality of terminals comprise a charge input terminal and a charge output terminal, wherein said charge switch delivers a charging current of said battery from said charge input terminal to said charge output terminal when said charge switch is on, and wherein when said charge switch is off, said control circuit receives a first voltage at said charge input terminal and a second voltage at said charge output terminal, compares a voltage difference between said first and second voltages with said voltage reference, and detects whether a charger is connected to said interface according to a result of the comparison between said voltage difference and said voltage reference.

15. The battery pack of claim 13, wherein said plurality of terminals comprise a discharge input terminal and a discharge output terminal, wherein said discharge switch delivers a discharging current of said battery from said discharge input terminal to said discharge output terminal when said discharge switch is on, and wherein when said discharge switch is off, said control circuit provides a current to charge a capacitor coupled to said discharge output terminal, receives a first voltage at said discharge input terminal and a second voltage at said discharge output terminal, compares a voltage difference between said first and second voltages with said voltage reference, and detects whether said load is removed from said interface according to a result of the comparison between said voltage difference and said voltage reference.

16. The battery pack of claim 13, wherein said switch circuit selectively delivers a current from a charge input terminal to said battery or a current from said battery to a discharge output terminal under control of said driving signals, and wherein said control circuit comprises:
a reference generator, coupled to said comparator, that controls a level of said voltage reference according to said driving signals; and
a multiplexer, coupled to said comparator and said switch circuit, that receives an input voltage at said charge input terminal and an output voltage at said discharge output terminal, and selectively provides a voltage of said input and output voltages to said comparator according to said driving signals.

17. A method comprising:
generating a plurality of driving signals to control a status of a switch circuit thereby enabling charging or discharging of a battery pack, wherein said switch circuit comprises a charge switch, a discharge switch, and a plurality of terminals coupled to said charge switch and said discharges switch;
receiving power to charge said battery pack in a charge mode via an interface of said battery pack when said charge switch is on;
providing power from said battery pack to a load in a discharge mode via said interface of said battery pack when said discharge switch is on;
receiving voltages at said plurality of terminals of said switch circuit; and
detecting a status of said interface according to said status of said switch circuit and a difference between said voltages, wherein said detecting comprises:
comparing said difference between said voltages with a voltage reference to generate a comparison result, using a comparator; and
determining said status of said interface according to said comparison result.

18. The method of claim 17, wherein said plurality of terminals comprise a charge input terminal and a charge output terminal, and wherein said method further comprises:
when said charge switch in said switch circuit is on, delivering a charging current of said battery pack from said charge input terminal to said charge output terminal through said charge switch; and
when said charge switch is off, performing a plurality of steps comprising:
receiving a first voltage at said charge input terminal and a second voltage at said charge output terminal;
comparing a voltage difference between said first and second voltages with said voltage reference; and
detecting whether a charger is connected to said interface according to a result of the comparison between said voltage difference and said voltage reference.

19. The method of claim 17, wherein said plurality of terminals comprise a discharge input terminal and a discharge output terminal, and wherein said method further comprises:

when said discharge switch in said switch circuit is on, delivering a discharging current from said discharge input terminal to said discharge output terminal through said discharge switch; and when said discharge switch is off, performing a plurality of steps comprising:

providing a current to charge a capacitor coupled to said discharge output terminal;

receiving a first voltage at said discharge input terminal and a second voltage at said discharge output terminal;

comparing a voltage difference between said first and second voltages with said voltage reference; and detecting whether said load is removed from said interface according to a result of the comparison between said voltage difference and said voltage reference.

20. The method of claim 17, further comprising:

selectively delivering a current from a charge input terminal to charge said battery pack or delivering a discharging current of said battery pack to a discharge output terminal under control of said driving signals;

controlling a level of said voltage reference according to said driving signals;

receiving an input voltage at said charge input terminal and an output voltage at said discharge output terminal; and selectively providing a voltage of said input and output voltages to said comparator according to said driving signals.

* * * * *